United States Patent
Do

(10) Patent No.: US 11,764,241 B2
(45) Date of Patent: Sep. 19, 2023

(54) IMAGE SENSING DEVICE INCLUDING VARIOUS OPTICAL FILTERS

(71) Applicant: SK hynix Inc., Icheon-si (KR)

(72) Inventor: Young Woong Do, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 17/499,733

(22) Filed: Oct. 12, 2021

(65) Prior Publication Data

US 2022/0190018 A1 Jun. 16, 2022

(30) Foreign Application Priority Data

Dec. 15, 2020 (KR) .................. 10-2020-0175695

(51) Int. Cl.
*H01L 27/146* (2006.01)
*H04N 25/59* (2023.01)
*H04N 25/585* (2023.01)

(52) U.S. Cl.
CPC .. *H01L 27/14621* (2013.01); *H01L 27/14605* (2013.01); *H04N 25/59* (2023.01)

(58) Field of Classification Search
CPC ............. H04N 5/35563; H04N 5/2254; H04N 5/36955; H04N 9/0451; H04N 9/0457; H04N 5/3559; H04N 25/59; H04N 25/585; H01L 27/14605; H01L 27/14621; H01L 27/14603; H01L 27/14627
See application file for complete search history.

(56) References Cited

U.S. PATENT DOCUMENTS

| | | | |
|---|---|---|---|
| 9,666,631 B2 | 5/2017 | Lyu et al. | |
| 9,704,901 B2 | 7/2017 | Lin et al. | |
| 9,954,020 B1* | 4/2018 | Lu | ................ H04N 25/585 |
| 10,411,063 B2 | 9/2019 | Yang et al. | |
| 2015/0130010 A1* | 5/2015 | Li | ............ H01L 27/14607 |
| 2016/0211294 A1* | 7/2016 | Lin | ............ H01L 27/14621 |
| 2020/0310178 A1* | 10/2020 | Zhou | ............... G02F 1/13318 |
| 2021/0242256 A1* | 8/2021 | Kido | ................. H01L 27/146 |
| 2021/0248758 A1* | 8/2021 | Li | .................... G06T 7/248 |
| 2022/0311959 A1* | 9/2022 | Do | ............... H04N 25/585 |
| 2022/0377274 A1* | 11/2022 | Yahata | .................. H04N 25/57 |
| 2023/0018370 A1* | 1/2023 | Asatsuma | ............. H04N 25/77 |

* cited by examiner

*Primary Examiner* — Marly S Camargo
(74) *Attorney, Agent, or Firm* — Perkins Coie LLP

(57) ABSTRACT

An image sensing device includes a first pixel configured to generate an electrical signal in response to incident light and including a first optical filter configured to transmit the incident light corresponding to a first color; and a second pixel configured to generate another electrical signal in response to the incident light and including a second optical filter configured to transmit the incident light corresponding to the first color, wherein a thickness of the first optical filter is larger than a thickness of the second optical filter.

20 Claims, 9 Drawing Sheets

IMAGE SENSING DEVICE INCLUDING VARIOUS OPTICAL FILTERS

CROSS-REFERENCE TO RELATED APPLICATION

This patent document claims the priority and benefits of Korean patent application No. 10-2020-0175695, filed on Dec. 15, 2020, the disclosure of which is incorporated herein by reference in its entirety as part of the disclosure of this patent document.

TECHNICAL FIELD

The technology and implementations disclosed in this patent document generally relate to an image sensing device including optical filters adjacent to each other.

BACKGROUND

An image sensor is a device for capturing optical images by converting light into electrical signals using a semiconductor material that reacts to light. With the recent development of automotive, medical, computer and communication industries, the demand for high-performance image sensors has been increasing in various devices, for example, smartphones, digital cameras, game consoles, Internet of Things (IoT), robots, surveillance cameras, medical microcameras, etc.

Image sensors may be broadly classified into CCD (Charge Coupled Device) image sensors and CMOS (Complementary Metal Oxide Semiconductor) image sensors. The CCD image sensors may create high-quality, low-noise images, and traditionally have advantages over the CMOS image sensor in terms of noise characteristics. However, CMOS image sensors have a simpler and more convenient driving scheme, and thus may be preferred in some applications. In addition, CMOS image sensors may allow a signal processing circuit to be integrated into a single chip, which makes it easy to miniaturize CMOS image sensors for implementation in a product, with the added benefit of consuming very low power. CMOS image sensors can be fabricated using a CMOS fabrication technology, which results in low manufacturing costs. CMOS image sensors have been widely used due to their suitability for implementation in mobile devices.

SUMMARY

Various embodiments of the disclosed technology relate to an image sensing device capable of obtaining a high dynamic range (HDR) image by performing image capture only once (i.e., one photographing action).

In accordance with an embodiment of the disclosed technology, an image sensing device includes a first pixel configured to generate an electrical signal in response to incident light and including a first optical filter configured to transmit the incident light corresponding to a first color; and a second pixel configured to generate another electrical signal in response to the incident light and including a second optical filter configured to transmit the incident light corresponding to the first color, wherein a thickness of the first optical filter is larger than a thickness of the second optical filter.

In accordance with another embodiment of the disclosed technology, an image sensing device includes a substrate including first and second photoelectric conversion elements that operate to generate photocharges in response to incident light; and an optical filter array disposed over the substrate and configured to include a first optical filter corresponding to the first photoelectric conversion element and a second optical filter corresponding to the second photoelectric conversion element, wherein the first optical filter and the second optical filter are configured to filter a portion of the incident light corresponding to a first color to be received by the photoelectric conversion elements and a thickness of the first optical filter is larger than a thickness of the second optical filter.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
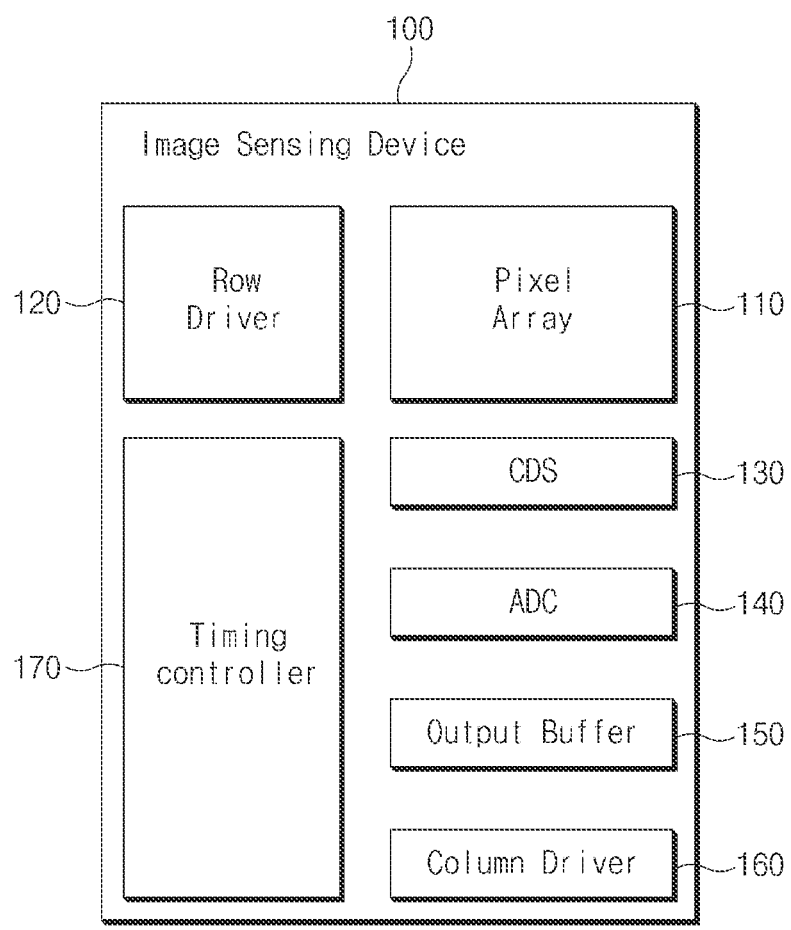
FIG. 1 is a schematic diagram illustrating an example of an image sensing device based on some implementations of the disclosed technology.

This patent document provides implementations and examples of image sensing device designs that may be used in configurations to substantially address one or more technical or engineering issues and to mitigate limitations or disadvantages encountered in some other image sensing device designs. Some implementations of the disclosed technology relate to the image sensing device including optical filters adjacent to each other. The disclosed technology provides various implementations of an image sensing device which can obtain a high dynamic range (HDR) image by performing image capture only once (i.e., one photographing action) without changing a complicated structure.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein.

FIG. 1 is a block diagram illustrating an image sensing device 100 according to an embodiment of the disclosed technology.

Referring to FIG. 1, the image sensing device 100 may include a pixel array 110, a row driver 120, a correlated double sampler (CDS) 130, an analog-digital converter (ADC) 140, an output buffer 150, a column driver 160 and a timing controller 170. The components of the image sensing device 100 illustrated in FIG. 1 are discussed by way of example only, and this patent document encompasses numerous other changes, substitutions, variations, alterations, and modifications.

The pixel array 110 may include a plurality of unit imaging pixels arranged in rows and columns. In one example, the plurality of unit imaging pixels can be arranged in a two dimensional pixel array including rows and columns. In another example, the plurality of unit imaging pixels can be arranged in a three dimensional pixel array. The plurality of unit imaging pixels may convert an optical signal into an electrical signal on a unit pixel basis or a pixel group basis, where unit pixels in a pixel group share at least certain internal circuitry. The pixel array 110 may receive driving signals, including a row selection signal, a pixel reset signal and a transmission signal, from the row driver 120. Upon receiving the driving signal, corresponding unit imaging pixels in the pixel array 110 may be activated to perform the operations corresponding to the row selection signal, the pixel reset signal, and the transmission signal.

The row driver 120 may activate the pixel array 110 to perform certain operations on the imaging pixels in the corresponding row based on commands and control signals provided by controller circuitry such as the timing controller 170. In some implementations, the row driver 120 may select one or more imaging pixels arranged in one or more rows of the pixel array 110. The row driver 120 may generate a row selection signal to select one or more rows among the plurality of rows. The row driver 120 may sequentially enable the pixel reset signal for resetting imaging pixels corresponding to at least one selected row, and the transmission signal for the pixels corresponding to the at least one selected row. Thus, a reference signal and an image signal, which are analog signals generated by each of the imaging pixels of the selected row, may be sequentially transferred to the CDS 130. The reference signal may be an electrical signal that is provided to the CDS 130 when a sensing node of an imaging pixel (e.g., floating diffusion node) is reset, and the image signal may be an electrical signal that is provided to the CDS 130 when photocharges generated by the imaging pixel are accumulated in the sensing node. The reference signal indicating unique reset noise of each pixel and the image signal indicating the intensity of incident light may be generically called a pixel signal as necessary.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments of the disclosed technology, the CDS 130 may sequentially sample and hold voltage levels of the reference signal and the image signal, which are provided to each of a plurality of column lines from the pixel array 110. That is, the CDS 130 may sample and hold the voltage levels of the reference signal and the image signal which correspond to each of the columns of the pixel array 110.

In some implementations, the CDS 130 may transfer the reference signal and the image signal of each of the columns as a correlate double sampling signal to the ADC 140 based on control signals from the timing controller 170.

The ADC 140 is used to convert analog CDS signals into digital signals. In some implementations, the ADC 140 may be implemented as a ramp-compare type ADC. The ramp-compare type ADC may include a comparator circuit for comparing the analog pixel signal with a reference signal such as a ramp signal that ramps up or down, and a timer for counting until a voltage of the ramp signal matches the analog pixel signal. In some embodiments of the disclosed technology, the ADC 140 may convert the correlate double sampling signal generated by the CDS 130 for each of the columns into a digital signal, and output the digital signal. The ADC 140 may perform a counting operation and a computing operation based on the correlate double sampling signal for each of the columns and a ramp signal provided from the timing controller 170. In this way, the ADC 140 may eliminate or reduce noises such as reset noise arising from the imaging pixels when generating digital image data.

The ADC 140 may include a plurality of column counters. Each column of the pixel array 110 is coupled to a column counter, and image data can be generated by converting the correlate double sampling signals received from each column into digital signals using the column counter. In another embodiment of the disclosed technology, the ADC 140 may include a global counter to convert the correlate double sampling signals corresponding to the columns into digital signals using a global code provided from the global counter.

The output buffer 150 may temporarily hold the column-based image data provided from the ADC 140 to output the image data. In one example, the image data from the ADC 140 may be temporarily stored in the output buffer 150 based on control signals of the timing controller 170. The output buffer 150 may provide an interface to compensate for transmission rate differences or processing rate differences between the image sensing device 100 and other devices.

The column driver 160 may select a column of the output buffer upon receiving a control signal from the timing controller 170, and sequentially output the image data, which are temporarily stored in the selected column of the output buffer 150. In some implementations, upon receiving an address signal from the timing controller 170, the column driver 160 may generate a column selection signal based on the address signal and select a column of the output buffer 150, outputting the image data as an output signal from the selected column of the output buffer 150.

The timing controller 170 may control operations of the row driver 120, the ADC 140, the output buffer 150 and the column driver 160.

The timing controller 170 may provide the row driver 120, the CDS 130, the ADC 140, the output buffer 150, and the column driver 160 with a clock signal required for the operations of the respective components of the image sensing device 100, a control signal for timing control, and address signals for selecting a row or column. In an embodiment of the disclosed technology, the timing controller 170 may include a logic control circuit, a phase lock loop (PLL) circuit, a timing control circuit, a communication interface circuit and others.

Figure 2:
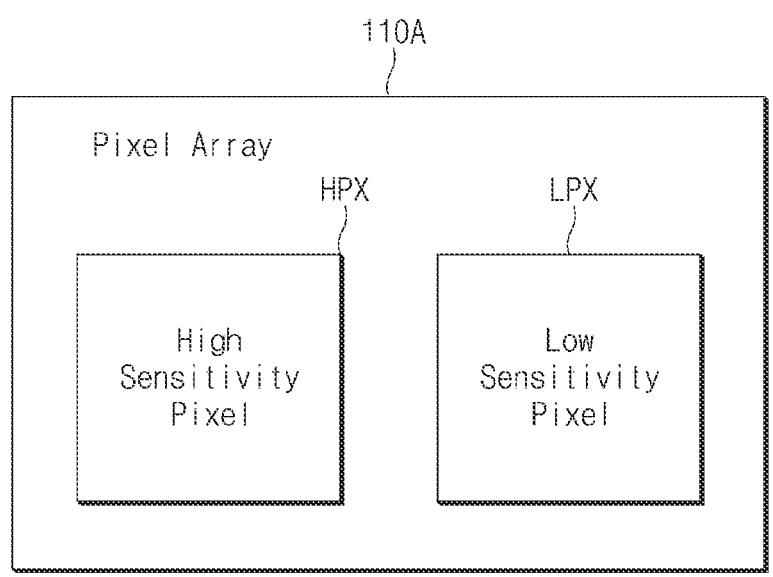
FIG. 2 is a schematic diagram illustrating an example of a pixel array shown in FIG. 1 based on some implementations of the disclosed technology.

FIG. 2 is a schematic diagram illustrating an example of a pixel array 110A shown in FIG. 1 based on some implementations of the disclosed technology.

Referring to FIG. 2, the pixel array 110A is an example of the pixel array 110 shown in FIG. 1. Although FIG. 2 shows that the pixel array 110A includes only two pixels, i.e., a high-sensitivity pixel (HPX) and a low-sensitivity pixel (LPX), other implementations are also possible. For example, the pixel array 110A may include N pixels, whereby N is a positive integer equal to or greater than 2. The pixel array 110A can include two kinds of pixels, i.e., a high-sensitivity pixel (HPX) with a higher sensing sensitivity or light-to-electrical conversion gain and a low-sensitivity pixel (LPX) with a lower sensing sensitivity or light-to-electrical conversion gain. Accordingly, each of the pixels included in the pixel array 110A may correspond to either the high-sensitivity pixel (HPX) or the low-sensitivity pixel (LPX). The high-sensitivity pixel (HPX) and the low-sensitivity pixel (LPX) may be simultaneously arranged in the pixel array 110A. The number of high-sensitivity pixels (HPX) and the number of low-sensitivity pixels (LPX) included in the pixel array 110A may be arbitrarily selected.

The high-sensitivity pixel (HPX) may be a pixel providing a relatively large increase in response due to an increase in the intensity of incident light. The "response" may refer to a pixel signal generated by the high-sensitivity pixel (HPX) in response to incident light. Thus, the high-sensitivity pixel (HPX) may refer to a pixel having a relatively high sensitivity to incident light.

The low-sensitivity pixel (LPX) may refer to a pixel having a relatively small increase in response due to an increase in the intensity of incident light. Thus, the low-sensitivity pixel (LPX) may refer to a pixel having a relatively low sensitivity to incident light.

Figure 3:
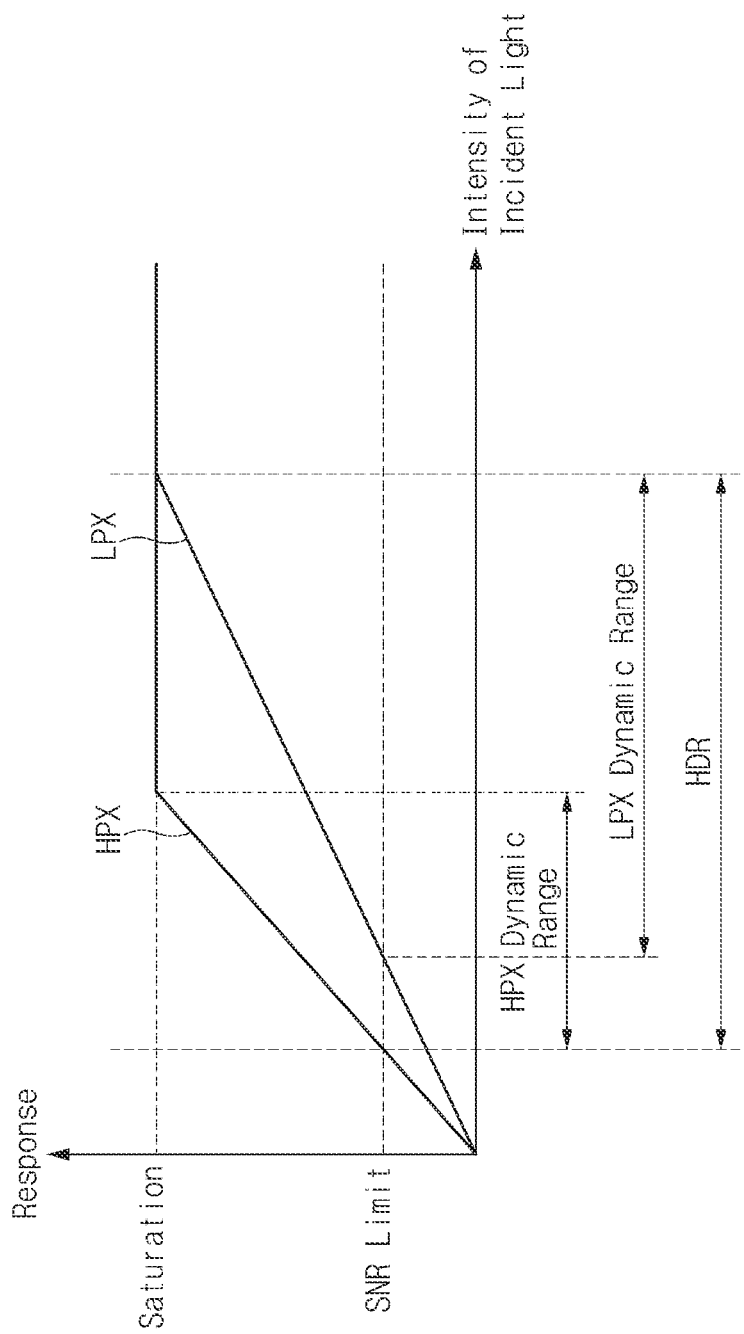
FIG. 3 is a graph illustrating example responses of a high-sensitivity pixel and a low-sensitivity pixel shown in FIG. 2 based on some implementations of the disclosed technology.

FIG. 3 is a graph illustrating example responses depending on illuminance of the high-sensitivity pixel (HPX) and the low-sensitivity pixel (LPX) shown in FIG. 2 based on some implementations of the disclosed technology.

As can be seen from FIG. 3, a response of the high-sensitivity pixel (HPX) and a response of the low-sensitivity pixel (LPX) are changed depending on illuminance indicating the intensity of incident light applied to the corresponding pixel.

In FIG. 3, two different responses are shown, one of which is a signal-to-noise ratio (SNR) threshold level and the other of which is a saturation level. The signal-to-noise ratio (SNR) threshold level refers to a threshold value that can satisfy a reference SNR that is predetermined. The response less than the SNR threshold level may be treated as an invalid response as not satisfying the reference SNR, and the response greater than the SNR threshold level may be treated as a valid response as satisfying the reference SNR.

The reference SNR may be determined experimentally in consideration of characteristics of the image sensing device 100.

A saturation level refers to a maximum level that indicates the intensity of incident light. The saturation level may be determined by the photo-conversion capability of a photo-electric conversion element to produce photocharges in response to the incident light and the electrical signal conversion capability of a floating diffusion (FD) region to output electrical signals corresponding to photocharges. As the intensity of incident light increases, the response may increase in proportional to the intensity of incident light until the response reaches the saturation level. After the response reaches the saturation level, the response may not increase although the intensity of incident light increases. For example, after the response reaches the saturation level, the response may have a same value as the saturation value and not increase above the saturation level.

The valid response of each pixel may refer to a response that can indicate the intensity of incident light while satisfying the reference SNR. The range of the intensity of incident light corresponding to the valid response of a pixel may be referred to as a dynamic range of the pixel. The pixel can provide a valid response during the dynamic range of the pixel.

The high-sensitivity pixel (HPX) provides the response having a relatively large increase in response to an increase in the intensity of incident light. Thus, the response of the high-sensitivity pixel (HPX) may have a relatively greater slope in response to the increase of the intensity of incident light until the response reaches to the saturation level and have a fixed level corresponding to the saturation level regardless of the increase of the intensity of incident light after the response reaches to the saturation level.

The low-sensitivity pixel (LPX) provides the response having a relatively small increase in response to an increase in the intensity of incident light. Thus, the response of the low-sensitivity pixel (LPX) may increase with a relatively smaller slope in response to the increase of the intensity of incident light until the response reaches to the saturation level, and have a fixed level corresponding to the saturation level regardless of the increase of the intensity of incident light after the response reaches to the saturation level.

As illustrated in FIG. 3, a minimum value of a high-sensitivity pixel (HPX) dynamic range may be less than the minimum value of a low-sensitivity pixel (LPX) dynamic range, and a maximum value of the high-sensitivity pixel (HPX) dynamic range may be less than the maximum value of the low-sensitivity pixel (LPX) dynamic range. Therefore, in a low-illuminance range in which the intensity of incident light is relatively small, the high-sensitivity pixel (HPX) may be more suitably used to sense the intensity of incident light. In a high-illuminance range in which the intensity of incident light is relatively large, the low-sensitivity pixel (LPX) may be more suitably used to sense the intensity of incident light.

In the implementations of the disclosed technology, high dynamic range (HDR) can be implemented using both a response of the high-sensitivity pixel (HPX) suitable for the low-illuminance range and a response of the low-sensitivity pixel (LPX) suitable for the high-illuminance range. As compared to the image sensing device including only one type of the pixel that is either the high-sensitivity pixel (HPX) or the low-sensitivity pixel (LPX) is used, the image sensing device including both the high-sensitivity pixel (HPX) and the low-sensitivity pixel (LPX) can allow the pixel array 110A to have a high dynamic range (HDR) that ranges from the minimum value of the HPX dynamic range to the maximum value of the LPX dynamic range. In the implementation of the disclosed technology, at least a portion of the HPX dynamic range and at least a portion of the LPX dynamic range may overlap each other.

A method for synthesizing a high dynamic range (HDR) image corresponding to the high dynamic range (HDR) using the high-sensitivity pixel (HPX) and the low-sensitivity pixel (LPX) may be implemented in various manners. For example, in some implementations, synthesizing of the HDR image by calculating (e.g., summing) the HPX response and the LPX response, and/or forming of an image based on the HPX response at a low-illuminance level and forming an image based on the LPX response at a high-illuminance level can be implemented. Without being limited thereto, other various imaging techniques can be implemented to provide a high dynamic range (HDR) image corresponding to the high dynamic range (HDR) using the high-sensitivity pixel (HPX) and the low-sensitivity pixel (LPX).

In the image sensing device 100, the high-sensitivity pixel (HPX) and the low-sensitivity pixel (LPX) are simultaneously arranged in the pixel array 110A, such that the image sensing device 100 can synthesize the HDR image using an image acquired through only one exposure time.

Figure 4:
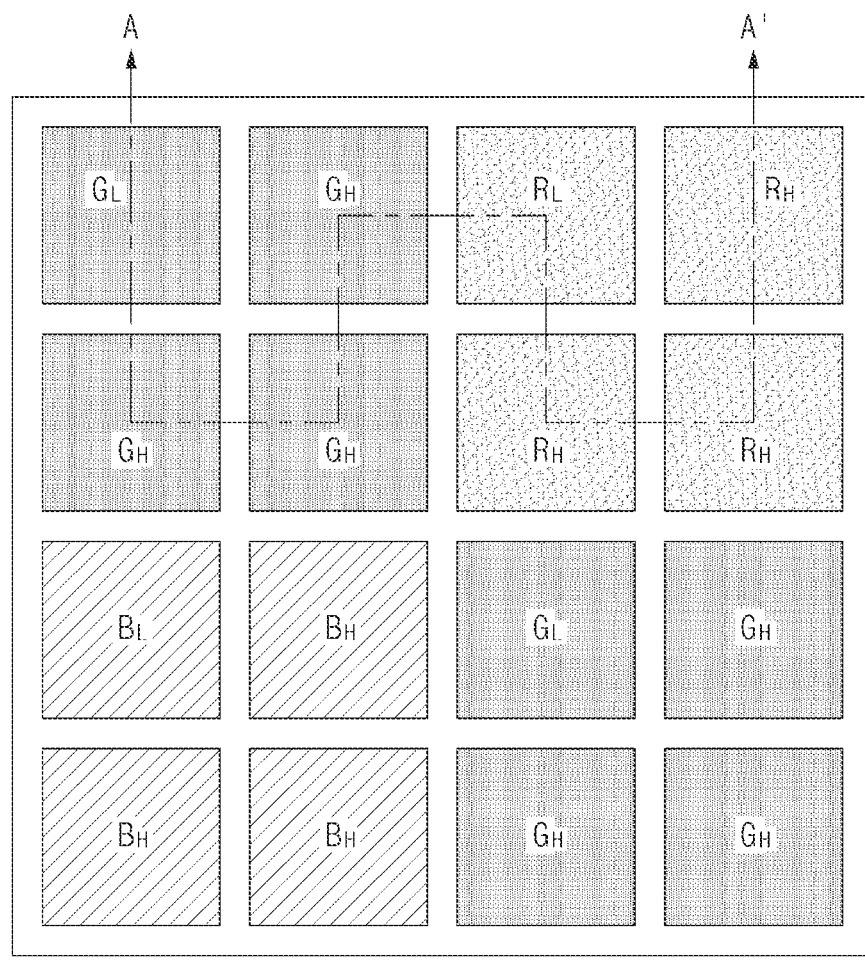
FIG. 4 is a schematic diagram illustrating an example of arrangement of high-sensitivity pixels and low-sensitivity pixels in the pixel array shown in FIG. 2 based on some implementations of the disclosed technology.

FIG. 4 is a schematic diagram illustrating an example of arrangement of the high-sensitivity pixels (HPX) and the low-sensitivity pixels (LPX) in the pixel array shown in FIG. 2 based on some implementations of the disclosed technology.

Referring to FIG. 4, the pixel array 110A-1 may illustrate an exemplary arrangement structure in which the high-sensitivity pixels (HPX) and the low-sensitivity pixels (LPX) are arranged in a (4×4) matrix array with 4 rows and 4 columns. Although the pixel array 110A-1 shown in FIG. 4 includes 16 pixels, other implementations are also possible. For example, 16 pixels may be repeatedly arranged in row and column directions of the pixel array 110A-1.

The pixel array 110A-1 may include first to fourth pixel groups, each of which corresponds to a (2×2) matrix array. Each pixel includes one or more photosensing elements that convert light into photocharge. In order to capture color information in the incident light, optical filters are provided to the pixels to capture color images and are structured to include optical filters in different colors to properly capture color information of a scene or object to be imaged. One of suitable optical filter arrangement is a Bayer color filter array of different optical filters that include 50% of the total optical filters to be green (G), 25% of the total optical filters to be blue (B) and 25% of the total optical filters to be red (R). In implementing a Bayer color filter array, two adjacent optical filters in the same row or column may be in different colors, or, alternatively, in the same color. One particular implementation of a Bayer color filter array for placing adjacent optical filters of the same color in a row or column is a Quad-Bayer pixel structure, in which adjacent 2×2 pixels of a 4-pixel block are of the same color as a basic building block while achieving the Bayer color arrangement by having 50% of the total 4-pixel blocks to be green (G), 25% of the total 4-pixel blocks to be blue (B) and 25% of the total 4-pixel blocks to be red (R). For example, one example of such a Quad-Bayer pixel structure may include a 4×4 4-pixel block pattern of one 4-pixel block of blue optical filters, one 4-pixel block of red optical filters, and two 4-pixel blocks of green optical filters. Such optical filters in the pixels and their arrangements can include certain combinations of high-sensitivity pixels and low-sensitivity pixels for each 4-pixel block of the same color. Such high-sensitivity pixels and low-sensitivity pixels can be achieved by using optical filters of different thickness values to create different optical attenuation levels so that a high-sensitivity pixel has a thinner optical filter than an optical filter of a low-sensitivity pixel which has a thicker optical filter.

As a specific example as shown in FIG. 4, each of the first pixel group and the fourth pixel group may include one low-sensitivity green pixel ($G_L$) and three high-sensitivity green pixels ($G_H$). The first pixel group and the fourth pixel group may be diagonally arranged in the row or column direction of the pixel array 110A-1. In this case, the low-sensitivity green pixel ($G_L$) may refer to a low-sensitivity pixel (LPX) that generates a pixel signal indicating the intensity of light corresponding to a wavelength range of green light from among red, green, and blue (RGB) lights of the incident light. The high-sensitivity green pixel ($G_H$) may refer to a high-sensitivity pixel (HPX) that generates a pixel signal indicating the intensity of light corresponding to a wavelength range of green light from among RGB lights of the incident light.

The second pixel group in the example in FIG. 4 may be disposed at the right side of the first pixel group, and may include one low-sensitivity red pixel ($R_L$) and three high-sensitivity red pixels ($R_H$). The low-sensitivity red pixel ($R_L$) may refer to a low-sensitivity pixel (LPX) that generates a pixel signal indicating the intensity of light corresponding to a wavelength range of red light from among RGB lights of the incident light. The high-sensitivity red pixel ($R_H$) may refer to a high-sensitivity pixel (HPX) that generates a pixel signal indicating the intensity of light corresponding to a wavelength range of red light from among RGB lights of the incident light.

The third pixel group in the example in FIG. 4 may be disposed below the first pixel group, and may include one low-sensitivity blue pixel ($B_L$) and three high-sensitivity blue pixels ($B_H$). The low-sensitivity blue pixel ($B_L$) may refer to a low-sensitivity pixel (LPX) that generates a pixel signal indicating the intensity of light corresponding to a wavelength range of blue light from among RGB lights of the incident light. The high-sensitivity blue pixel ($B_H$) may refer to a high-sensitivity pixel (HPX) that generates a pixel signal indicating the intensity of light corresponding to a wavelength range of blue light from among RGB lights of the incident light.

Although the low-sensitivity pixel (LPX) is disposed at a position corresponding to the left upper end of the (2×2) matrix in each of the first to fourth pixel groups, other implementations are also possible, and it should be noted that the low-sensitivity pixel (LPX) can also be disposed at other positions as needed. In addition, the number of low-sensitivity pixels (LPX) included in each of the first to fourth pixel groups may be set to 2 or 3.

Each of the first to fourth pixel groups may include four pixels having the same color, and the first to fourth pixel groups may be arranged in a Bayer pattern. Such arrangement structure may be defined as a quad Bayer pattern structure.

Figure 5:
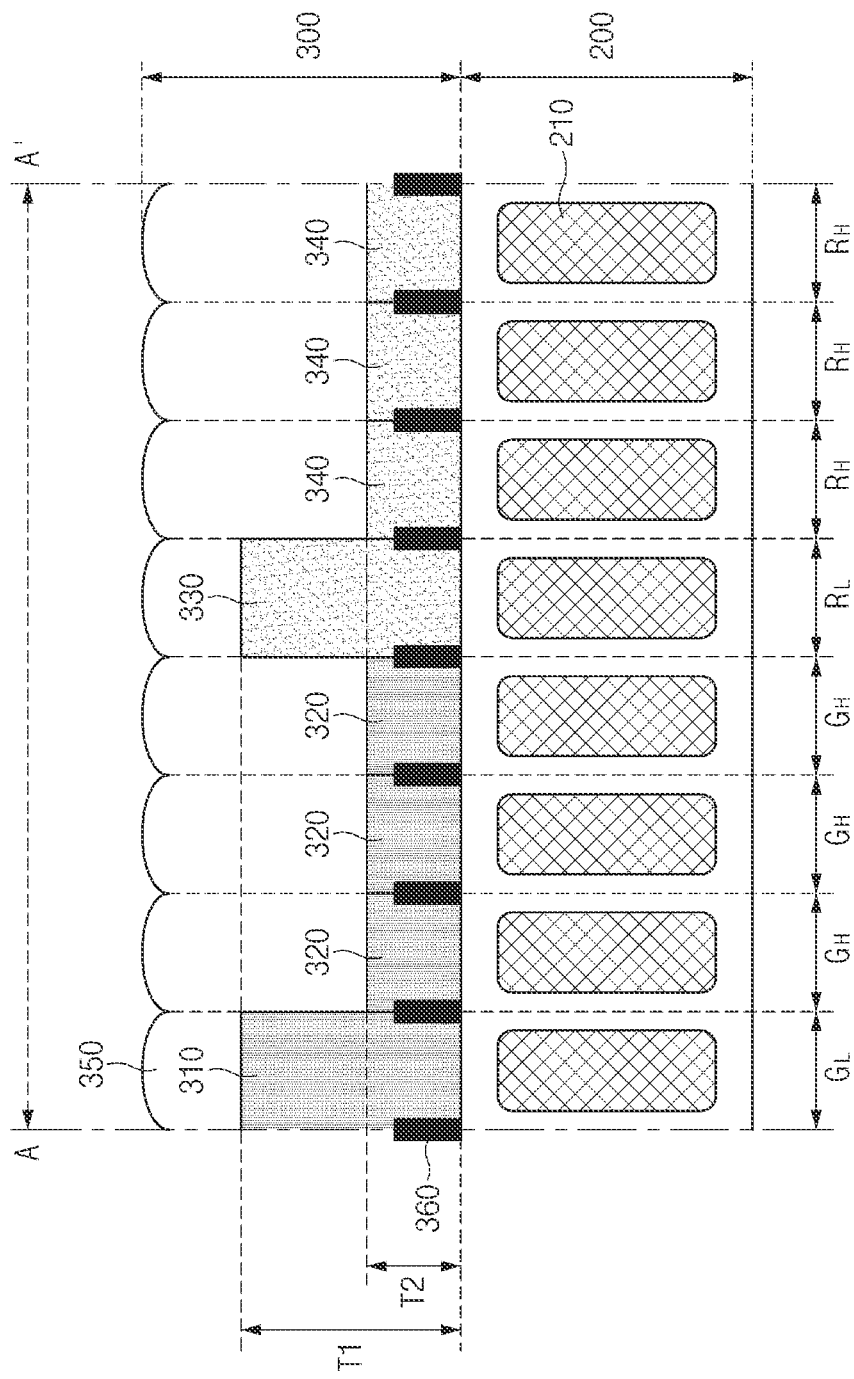
FIG. 5 is a cross-sectional view illustrating an example of pixels taken along a first cutting line shown in FIG. 4 based on some implementations of the disclosed technology.

FIG. 5 is a cross-sectional view illustrating an example of pixels taken along a first cutting line A-A' shown in FIG. 4 based on some implementations of the disclosed technology.

FIG. 5 is a cross-sectional view 110A-2 illustrating pixels taken along the first cutting line A-A' shown in FIG. 4.

The cross-sectional view 110A-2 may include a stacked structure of a substrate 200 and a light incident layer 300. In addition, the cross-sectional view 110A-2 may include pixels $G_L$, $G_H$, $R_L$, and $R_H$ that are arranged along the first cutting line A-A'.

The substrate 200 may include a top surface and a bottom surface that face each other. In the descriptions below, the bottom surface of the substrate 200 may correspond to a front side, and the top surface of the substrate 200 may correspond to a back side. However, other implementations are also possible. For example, the substrate 200 may be a P-type or N-type bulk substrate, may be a substrate formed by growing a P-type or N-type epitaxial layer on the P-type bulk substrate, or may be a substrate formed by growing a P-type or N-type epitaxial layer on the N-type bulk substrate.

The substrate 200 may include a plurality of photoelectric conversion elements 210. The photoelectric conversion elements 210 may be respectively disposed in the pixels $G_L$, $G_H$, $R_L$, and $R_H$, and may generate and accumulate photocharges in response to the intensity of incident light. Each of the photoelectric conversion elements 210 may be formed as an N-type doped region through ion implantation of N-type ions. In some implementations, the photoelectric conversion element 210 may be formed by stacking a plurality of doped regions. In this case, a lower doped region may be formed by implantation of $N^+$ ions, and an upper doped region may be formed by implantation of $N^-$ ions. The photoelectric conversion element 210 may be arranged across as large a region as possible to increase a fill factor indicating light reception (Rx) efficiency. In some implementations, a device isolation layer (not shown) disposed between photoelectric conversion elements 210 of the contiguous or adjacent pixels ($G_L$, $G_H$, $R_L$, $R_H$) may be formed to be deeply etched in a vertical direction, so that the device isolation layer can electrically or optically isolate the contiguous or adjacent pixels that are located adjacent to each other.

Photocharges accumulated in the photoelectric conversion elements 210 may be converted into pixel signals through a readout circuit connected to the photoelectric conversion elements 210, such that the pixel signals can be output to the column line. In some implementations, the readout circuit may include a floating diffusion (FD) node, a transfer transistor, a reset transistor, a source follower transistor, and a selection transistor.

The floating diffusion (FD) node may refer to a region that receives photocharges from the photoelectric conversion elements 210 and accumulates the received photocharges therein. The transfer transistor may transmit the photocharges accumulated in the photoelectric conversion elements 210 to the floating diffusion (FD) node in response to a transmission (Tx) signal received from the row driver 120. The reset transistor may reset the floating diffusion (FD) node to a reset voltage (e.g., a power-supply voltage) in response to a pixel reset signal received from the row driver 120. The source follower transistor may convert a potential of the floating diffusion (FD) node connected to a gate terminal thereof into an electrical signal, and may output the electrical signal to the selection transistor. The selection transistor may transmit the electrical signal received from the source follower transistor to the column line in response to a row selection signal received from the row driver 120. Here, the electrical signal transmitted to the column line by the selection transistor may serve as a pixel signal.

The light incident layer 300 may receive incident light from the outside of the image sensing device 100, and may transmit the received incident light to the substrate 200. The light incident layer 300 may include a plurality of first optical filters 310 and 330, a plurality of second optical filters 320 and 340, a plurality of microlenses 350, and a plurality of optical grid structures 360.

As can be seen from FIG. 5, the first optical filter 310 may be disposed to correspond to the pixel ($G_L$), and the first optical filer 330 may be disposed to correspond to the pixel ($R_L$). The second optical filters 320 and 340 may be disposed to correspond to the pixels $G_H$ and $R_H$, respectively. Each of the second optical filters 320 may be disposed to correspond to the pixel ($G_H$), and each of the second optical filters 340 may be disposed to correspond to the pixel ($R_H$).

The first optical filters 310 and 330 and the second optical filters 320 and 340 may be disposed and the optical grid structures 360 can be formed between any two adjacent ones of the optical filters including the first optical filters 310 and 330 and the second optical filters 320 and 340 and at an upper portion of the substrate 200. Each of the first optical filters 310 and 330 and the second optical filters 320 and 340 may transmit light (e.g., red light, green light, blue light, magenta light, yellow light, cyan light, infrared (IR) light, or the like) having a certain wavelength band. In this case, the wavelength band may refer to a wavelength band of light to be transmitted by the corresponding optical filter. For example, each of the first optical filters 310 and 330 and the second optical filters 320 and 340 may include a colored photosensitive material corresponding to a specific color, or may include thin film layers that are alternately arranged. The optical filters included in the pixel array 110 may be arranged to correspond to the pixels arranged in a matrix array including a plurality of rows and a plurality of columns, resulting in formation of an optical filter array.

In FIG. 5, each of the first optical filter 310 and the second optical filter 320 may correspond to a green color filter that transmits light having a transmission wavelength band corresponding to a green color. The first optical filter 310 may be disposed in the low-sensitivity green pixel ($G_L$), and the second optical filter 320 may be disposed in the high-sensitivity green pixel ($G_H$).

In FIG. 5, each of the first optical filter 330 and the second optical filter 340 may correspond to a red color filter that transmits light having a wavelength band corresponding to a red color. The first optical filter 330 may be disposed in the low-sensitivity red pixel ($R_L$), and the second optical filter 340 may be disposed in the high-sensitivity red pixel ($R_H$).

A first thickness T1 of each of the first optical filters 310 and 330 may be larger than a second thickness T2 of each of the second optical filters 320 and 340.

Each of the optical filters may absorb a relatively small amount of light in a transmission wavelength band, and may absorb a relatively large amount of light in the remaining wavelength bands (i.e., a blocking wavelength band) other than the transmission wavelength band, such that the optical filter can transmit light corresponding to the transmission wavelength band while blocking light corresponding to the remaining wavelength bands. As the thickness of the optical filter through which incident light passes increases, a light absorption rate of the optical filter may increase over the entire wavelength band. This is because that as the optical filter increases in thickness, the light absorption rate of light corresponding to the blocking wavelength band and the light absorption rate of light corresponding to the transmission wavelength band increase, which results in reduction in light transmittance of the light corresponding to the transmission wavelength band. The light absorption rate refers to the ratio of the incident light that is incident upon the optical filter to the absorption light that is absorbed by the optical filter. The light transmittance refers to the ratio of the incident light that is incident upon the optical filter to the transmission light passing through the optical filter.

Therefore, light transmittance of light having the transmission wavelength band of the first optical filter 310 or 330 having the first thickness T1 that is relatively large may be lower than light transmittance of light having the transmission wavelength band of the second optical filter 320 or 340 having the second thickness T2 that is relatively small.

When light beams having the same intensity are incident upon the first optical filters 310 and 330 and the second optical filters 320 and 340, the intensity of light having a transmission wavelength band passing through the first optical filters 310 and 330 may be less than the intensity of light having a transmission wavelength band passing through the second optical filters 320 and 340.

The intensity of light corresponding to the transmission wavelength band passing through the first optical filters 310 and 330 may increase with a relatively lower slope in response to the increasing intensity of incident light. The intensity of light corresponding to the transmission wavelength band passing through the second optical filters 320 and 340 may increase with a relatively higher slope in response to the increasing intensity of incident light.

The intensity of light corresponding to the transmission wavelength band having penetrated each of the first optical filters 310 and 330 and the second optical filters 320 and 340 may be converted into a pixel signal by the photoelectric conversion element 210 and the readout circuit. As a result, the response of the pixel including the first optical filter 310 or 330 may be configured to follow the response of the low-sensitivity pixel (LPX) shown in FIG. 3, and the response of the pixel including the second optical filter 320 or 340 may be configured to follow the response of the high-sensitivity pixel (HPX) shown in FIG. 3.

Accordingly, the pixel including the first optical filter 310 or 330 may correspond to the low-sensitivity pixel (LPX), and the pixel including the second optical filter 320 or 340 may correspond to the high-sensitivity pixel (HPX).

The image sensing device 100 based on some implementations of the disclosed technology can allow a plurality of optical filters to have different thicknesses, and can simultaneously implement the low-sensitivity pixel (LPX) and the high-sensitivity pixel (HPX) in only one pixel array, such that the image sensing device 100 can form a high dynamic range (HDR) image using only one image.

Although it has been described as an example that the first optical filters respectively included in the low-sensitivity green pixel ($G_L$), the low-sensitivity red pixel ($R_L$), and the low-sensitivity blue pixel ($B_L$) have the same thickness, and the second optical filters respectively included in the high-sensitivity green pixel ($G_H$), the high-sensitivity red pixel ($R_H$), and the high-sensitivity blue pixel ($B_H$) have the same thickness, other implementations are also possible. Thus, the thicknesses of the optical filters can be designed in different manners. For example, the thickness of the first optical filter may increase in the order of the low-sensitivity green pixel ($G_L$), the low-sensitivity blue pixel ($B_L$), and the low-sensitivity red pixel ($R_L$), and the thickness of the second optical filter may increase in the order of the high-sensitivity green pixel ($G_H$), the high-sensitivity blue pixel ($B_H$), and the high-sensitivity red pixel ($R_H$). Since the efficiency of photoelectric conversion achieved by the photoelectric conversion element 210 and the penetration depth of light incident upon the pixel are changed depending on whether the corresponding pixel is a green pixel, a blue pixel, or a red pixel, the thickness of the first optical filters may increase in the order of the low-sensitivity pixels ($G_L$, $B_L$, $R_L$) and the thickness of the second optical filters may increase in the order of the high-sensitivity pixels ($G_H$, $B_H$, $R_H$), such that uniformity of the pixel signal for each color can be guaranteed.

The microlenses 350 may be formed over the optical filters 310 to 340, and may increase light gathering power of incident light, resulting in increased light reception (Rx) efficiency of the substrate 200.

The optical grid structures 360 may prevent light incident upon the optical filters 310 to 340 from moving to adjacent pixels, thereby minimizing optical crosstalk between the adjacent pixels.

Figure 6:
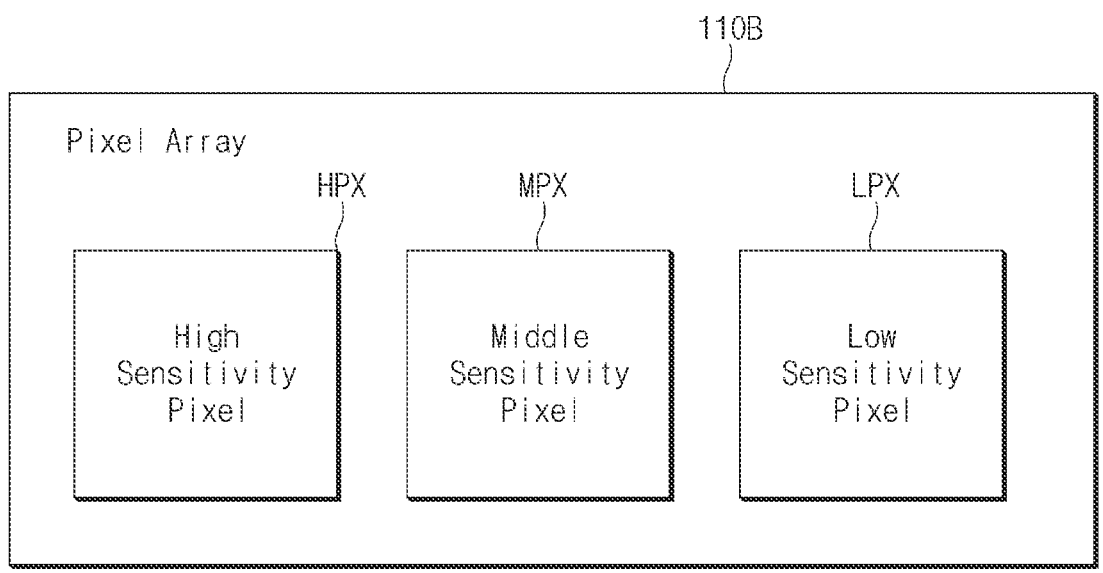
FIG. 6 is a schematic diagram illustrating another example of the pixel array shown in FIG. 1 based on some implementations of the disclosed technology.

FIG. 6 is a schematic diagram illustrating another example of the pixel array shown in FIG. 1 based on some implementations of the disclosed technology.

Referring to FIG. 6, the pixel array 110B is an example of the pixel array 110 shown in FIG. 1. Although the pixel array 110B includes three pixels, i.e., a high-sensitivity pixel (HPX), a middle-sensitivity pixel (MPX), and a low-sensitivity pixel (LPX), other implementations are also possible. For example, the pixel array 110B may include N pixels, whereby N is a positive integer that is not 3. The pixels included in the pixel array 110B may include three kinds of pixels, i.e., a high-sensitivity pixel (HPX), a middle-sensitivity pixel (MPX), and a low-sensitivity pixel (LPX). Accordingly, each of the pixels included in the pixel array 110B may correspond to any one of the high-sensitivity pixel (HPX), the middle-sensitivity pixel (MPX), and the low-sensitivity pixel (LPX). The high-sensitivity pixel (HPX), the middle-sensitivity pixel (MPX), and the low-sensitivity pixel (LPX) may be simultaneously arranged in the pixel array 110B. The number of high-sensitivity pixels (HPX), the number of middle-sensitivity pixels (MPX), and the number of low-sensitivity pixels (LPX) included in the pixel array 110B may be arbitrarily selected.

The high-sensitivity pixel (HPX) and the low-sensitivity pixel (LPX) shown in FIG. 6 are substantially identical to those of FIG. 2, and as such a detailed description thereof will herein be omitted for convenience of description.

The middle-sensitivity pixel (MPX) may be a pixel in which the amount of increase in response due to an increase in the intensity of incident light is larger than that of the low-sensitivity pixel (LPX) and is less than that of the high-sensitivity pixel (HPX).

Figure 7:
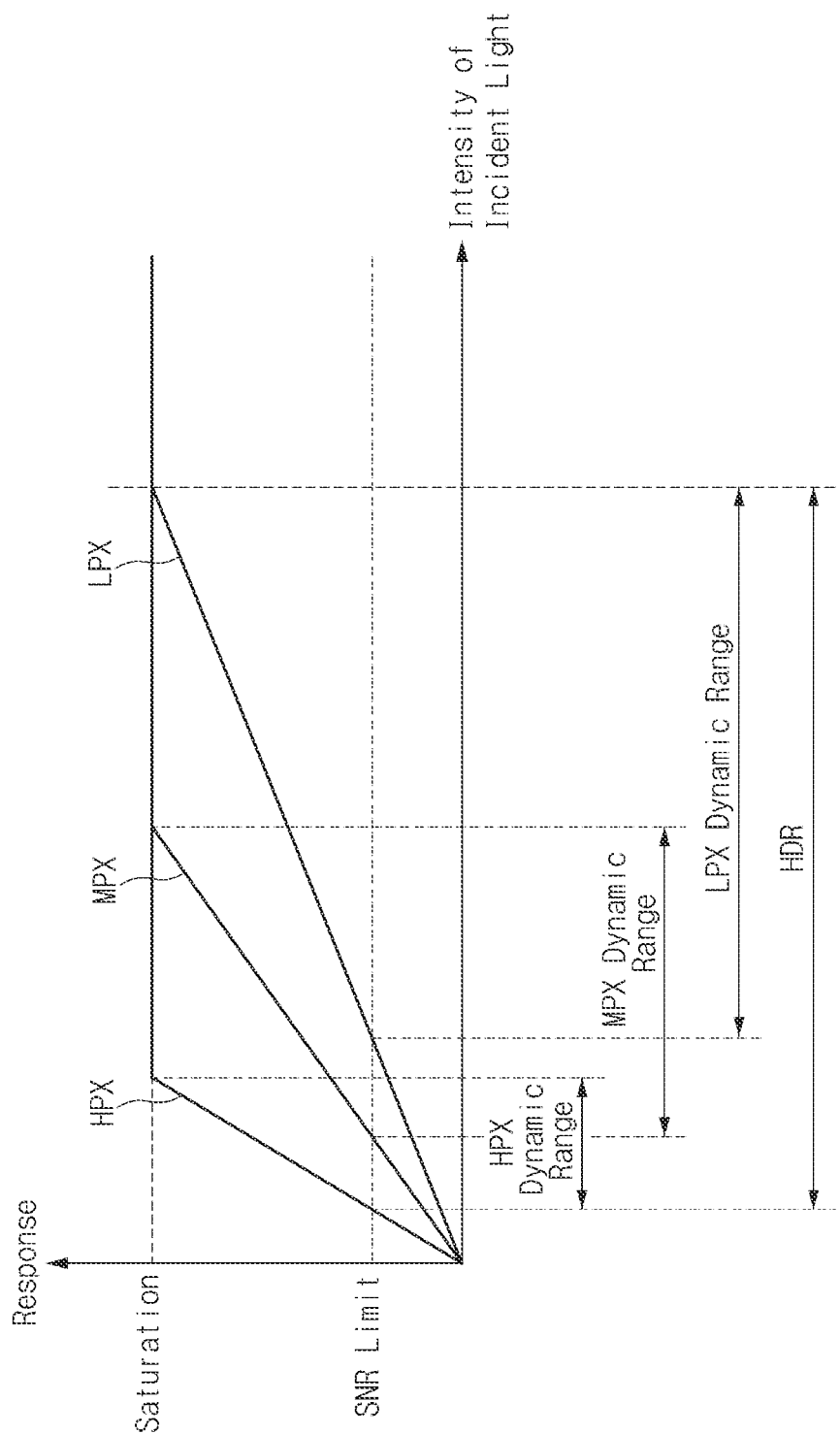
FIG. 7 is a graph illustrating an example of responses depending on illuminance of a high-sensitivity pixel, a middle-sensitivity pixel, and a low-sensitivity pixel shown in FIG. 6 based on some implementations of the disclosed technology.

FIG. 7 is a graph illustrating an example of responses depending on illuminance of the high-sensitivity pixel (HPX), the middle-sensitivity pixel (MPX), and the low-sensitivity pixel (LPX) shown in FIG. 6 based on some implementations of the disclosed technology.

As can be seen from FIG. 7, a response of the high-sensitivity pixel (HPX), a response of the middle-sensitivity pixel (MPX), and a response of the low-sensitivity pixel (LPX) are changed depending on illuminance indicating the intensity of incident light applied to the corresponding pixel. The HPX response and the LPX response shown in FIG. 7 are substantially identical to those of FIG. 3, and as such a detailed description thereof will herein be omitted.

The middle-sensitivity pixel (MPX) provides the response such that the amount of increase in response to an increase of the intensity of incident light is higher than that of the low-sensitivity pixel (LPX) and less than that of the high-sensitivity pixel (HPX). Thus, the response of the middle-sensitivity pixel (MPX) increase until the response reaches the saturation level with a slope that is higher than that of the low-sensitivity pixel (LPX) and is lower than that of the high-sensitivity pixel (HPX) in response to the increasing intensity of incident light and have a fixed level even with the increase of the intensity of incident light after the response reaches the saturation level.

Assume the case that only the high-sensitivity pixel (HPX) and the low-sensitivity pixel (LPX) are included without the middle-sensitivity pixel (MPX) and that the amount of increase in response of the low-sensitivity pixel (LPX) due to an increase in the intensity of incident light decrease or the amount of increase of the high-sensitivity pixel in response due to an increase in the intensity of incident light increases. In this case, the minimum value of the low-sensitivity pixel (LPX) dynamic range may exceed the maximum value of the high-sensitivity pixel (HPX) dynamic range, which causes a gap to occur between the LPX dynamic range and the HPX dynamic range. As a result, the image sensing device 100 may not obtain a valid response at a level of illuminance corresponding to such gap.

In the implementation of FIG. 6 such gap can be prevented from occurring by providing the middle-sensitivity pixel (MPX). Since the middle-sensitivity pixel (MPX) provides the response such that the amount of increase in response due to an increase in the intensity of incident light is higher than that of the low-sensitivity pixel (LPX) and is less than that of the high-sensitivity pixel (HPX), the MPX dynamic range may have the maximum value higher than the minimum value of the LPX dynamic range, and may have the minimum value less than the maximum value of the HPX dynamic range. As a result, the MPX dynamic range can cover the gap between the LPX dynamic range and the HPX dynamic range.

High dynamic range (HDR) can be implemented using a response of the high-sensitivity pixel (HPX) suitable for the low-illuminance range, a response of the middle-sensitivity pixel (MPX) suitable for the middle-illuminance range, and a range of the low-sensitivity pixel (LPX) suitable for the high-illuminance range.

Thus, the implementation providing the pixels including the high-sensitivity pixel (HPX), the middle-sensitivity pixel (MPX), and the low-sensitivity pixel (LPX) can allow the pixel array 110B to have a high dynamic range (HDR) that ranges from the minimum value of the HPX dynamic range to the maximum value of the LPX dynamic range without causing the gap between the HPX dynamic range and the LPX dynamic range. In the implementation of the disclosed technology, at least a portion of the HPX dynamic range, at least a portion of the MPX dynamic range, and at least a portion of the LPX dynamic range may overlap each other.

A method for synthesizing the HDR image corresponding to the high dynamic range (HDR) using the high-sensitivity pixel (HPX), the middle-sensitivity pixel (MPX), and the low-sensitivity pixel (LPX) may be implemented in various manners. For example, in some implementations, synthesizing of the HDR image by calculating (e.g., summing) the HPX response, the MPX response, and the LPX response, and/or forming of an image based on the HPX response at a low-illuminance level, forming of an image based on the MPX response at a middle-illuminance level, and forming of an image based on the LPX response at a high-illuminance level can be implemented. Without being limited thereto, other various imaging techniques can be implemented to provide a high dynamic range (HDR) image corresponding to the high dynamic range (HDR) using the high-sensitivity pixel (HPX), the middle-sensitivity pixel (MPX) and the low-sensitivity pixel (LPX).

In the image sensing device 100, the high-sensitivity pixel (HPX), the middle-sensitivity pixel (MPX), and the low-sensitivity pixel (LPX) are simultaneously arranged in the pixel array 110B, such that the image sensing device 100 can synthesize the HDR image using an image acquired through only one exposure.

Figure 8:
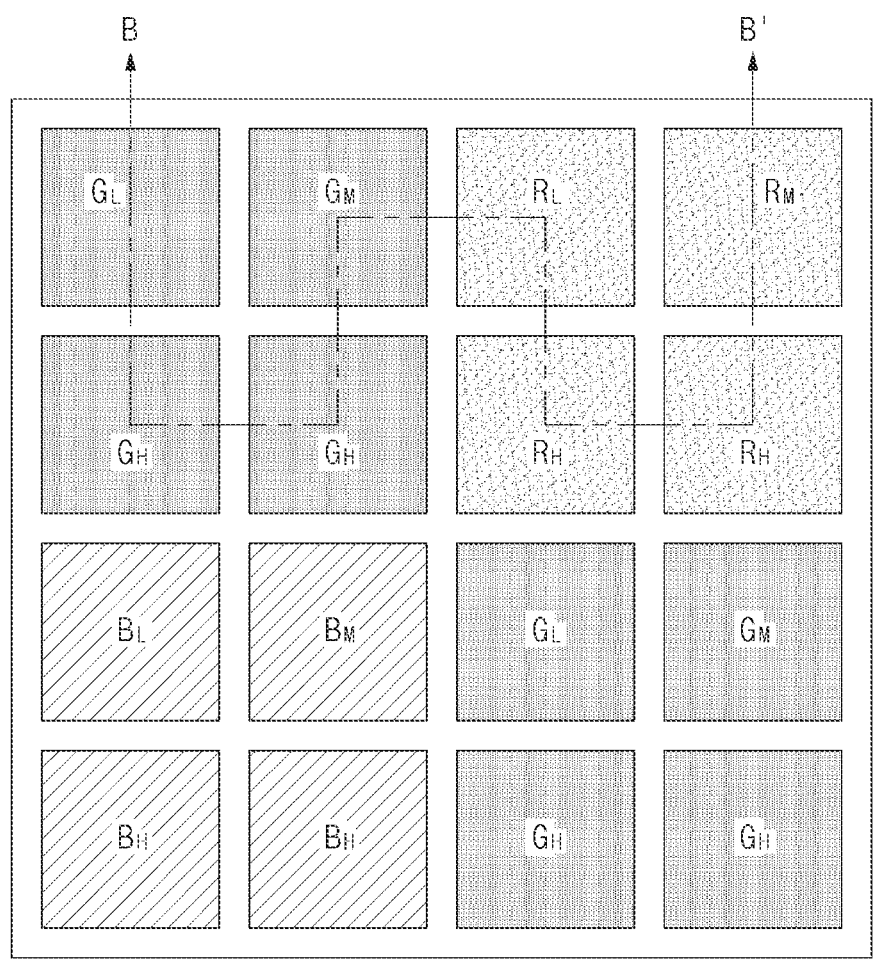
FIG. 8 is a schematic diagram illustrating an example of arrangement of a high-sensitivity pixel, a middle-sensitivity pixel, and a low-sensitivity pixel in the pixel array shown in FIG. 6 based on some implementations of the disclosed technology.

FIG. 8 is a schematic diagram illustrating an example of arrangement of the high-sensitivity pixel (HPX), the middle-sensitivity pixel (MPX), and the low-sensitivity pixel (LPX) in the pixel array shown in FIG. 6 based on some implementations of the disclosed technology.

Referring to FIG. 8, the pixel array 110B-1 may illustrate an exemplary arrangement structure in which the high-sensitivity pixels (HPX), the middle-sensitivity pixels (MPX), and the low-sensitivity pixels (LPX) are arranged in a (4×4) matrix array including 4 rows and 4 columns. Although the pixel array 110B-1 shown in FIG. 8 includes 16 pixels, other implementations are also possible. For example, 16 pixels may be repeatedly arranged in row and column directions of the pixel array 110B-1.

The pixel array 110B-1 may include fifth to eighth pixel groups, each of which corresponds to a (2×2) matrix array.

Each of the fifth pixel group and the eighth pixel group may include one low-sensitivity green pixel ($G_L$), one middle-sensitivity green pixel ($G_M$), and two high-sensitivity green pixels ($G_H$). The fifth pixel group and the eighth pixel group may be diagonally arranged in the row or column direction of the pixel array 110B-1. In this case, the middle-sensitivity green pixel ($G_M$) may refer to a middle-sensitivity pixel (MPX) that generates a pixel signal indicating the intensity of light corresponding to a wavelength range of green light from among RGB lights of the incident light.

The sixth pixel group may be disposed at the right side of the fifth pixel group, and may include one low-sensitivity red pixel ($R_L$), one middle-sensitivity red pixel ($R_M$), and two high-sensitivity red pixels ($R_H$). The middle-sensitivity red pixel ($R_M$) may refer to a middle-sensitivity pixel (MPX) that generates a pixel signal indicating the intensity of light corresponding to a wavelength range of red light from among RGB lights of the incident light.

The seventh pixel group may be disposed below the fifth pixel group, and may include one low-sensitivity blue pixel ($B_L$), one middle-sensitivity blue pixel ($B_M$), and two high-sensitivity blue pixels ($B_H$). The middle-sensitivity blue pixel ($B_M$) may refer to a middle-sensitivity pixel (MPX) that generates a pixel signal indicating the intensity of light corresponding to a wavelength range of blue light from among RGB lights of the incident light.

Although the low-sensitivity pixel (LPX) is disposed at a position corresponding to the left upper end of the (2×2) matrix in each of the fifth to eighth pixel groups and the middle-sensitivity pixel (MPX) is disposed at a position corresponding to the right upper end of the (2×2) matrix in each of the fifth to eighth pixel groups, other implementations are also possible, and it should be noted that the low-sensitivity pixel (LPX) and the middle-sensitivity pixel (MPX) can also be disposed at other positions as needed. In addition, the number of low-sensitivity pixels (LPX) included in each of the fifth to eighth pixel group or the number of middle-sensitivity pixels (MPX) included in each of the fifth to eighth pixel group may be set to 2.

Figure 9:
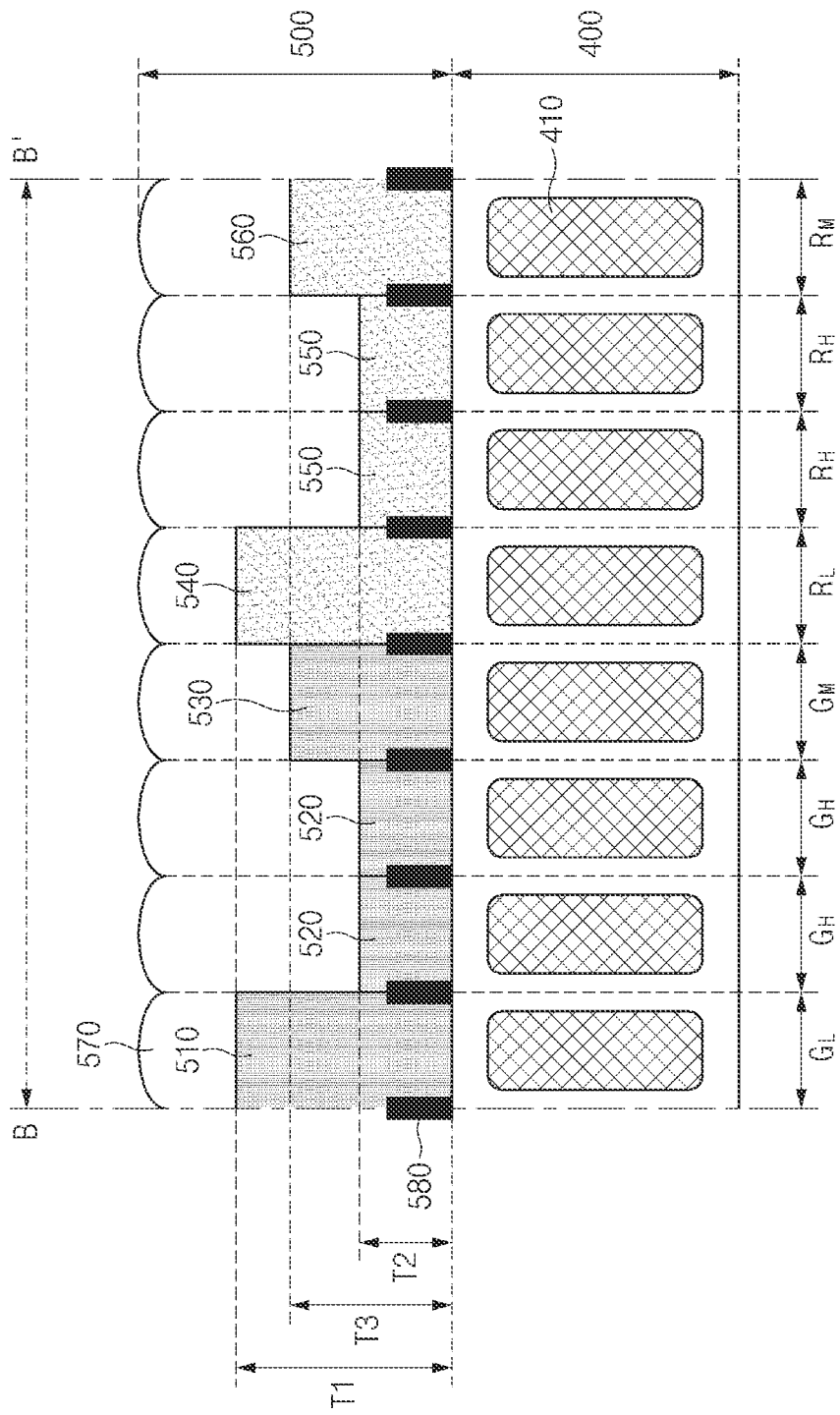
FIG. 9 is a cross-sectional view illustrating an example of pixels taken along a second cutting line shown in FIG. 8 based on some implementations of the disclosed technology.

FIG. 9 is a cross-sectional view illustrating an example of pixels taken along a second cutting line B-B' shown in FIG. 8 based on some implementations of the disclosed technology.

FIG. 9 is a cross-sectional view 110B-2 illustrating pixels that are taken along the second cutting line B-B' shown in FIG. 8 and are included in the fifth and sixth pixel groups.

The cross-sectional view 110B-2 may include a stacked structure of a substrate 400 and a light incident layer 500. In addition, the cross-sectional view 110B-2 may include pixels $G_L$, $G_H$, $G_M$, $R_L$, $R_H$, $R_M$ consecutively arranged along the second cutting line B-B'. The substrate 400 and the light incident layer 500 shown in FIG. 8 may be substantially identical in structure and function to the substrate 200 and the light incident layer 300 shown in FIG. 5, and as such a detailed description thereof will herein be omitted.

The light incident layer 500 may include a plurality of first optical filters 510 and 540, a plurality of second optical filters 520 and 550, a plurality of third optical filters 530 and 560, a plurality of microlenses 570, and a plurality of optical grid structures 580. Unlike the light incident layer 300 shown in FIG. 5, the light incident layer 500 may further include the third optical filters 530 and 560.

Although the third optical filters 530 and 560 are identical in material and function to those of the first optical filters 510 and 540 or the second optical filters 520 and 550, other implementations are also possible. Each of the third optical filters 530 and 560 may be smaller in thickness than each of the first optical filters 510 and 540 and may be larger in thickness than each of the second optical filters 520 and 550.

In FIG. 9, the third optical filter 530 may correspond to a green color filter that selectively transmits light having a transmission wavelength band corresponding to a green color. In addition, the third optical filter 530 may be disposed in the middle-sensitivity green pixel ($G_M$).

In FIG. 9, the third optical filter 560 may correspond to a red color filter that selectively transmits light having a transmission wavelength band corresponding to a red color. In addition, the third optical filter 560 may be disposed in the middle-sensitivity red pixel ($R_M$).

Light transmittance of light having the transmission wavelength band of the third optical filter 530 or 560 having a third thickness T3 that is smaller than the first thickness T1 and is larger than the second thickness T2 may be higher than light transmittance of light having the transmission wavelength band of the first optical filter 510 or 540 having the first thickness T1, and may be lower than light transmittance of light having the transmission wavelength band of the second optical filter 520 or 550 having the second thickness T2.

When light beams having the same intensity are incident upon the first optical filters 510 and 540, the second optical filters 520 and 550, and the third optical filters 530 and 560, the intensity of light having a transmission wavelength band passing through the third optical filters 530 and 560 may be greater than the intensity of light having penetrated the first optical filters 510 and 540, and may be less than the intensity of light passing through the second optical filters 520 and 550.

The intensity of light corresponding to a transmission wavelength band passing through the third optical filters 530 and 560 may increase with an intermediate slope between a slope of the first optical filters 510 and 540 and a slope of the second optical filters 520 and 550 in response to the increasing intensity of incident light.

The intensity of light corresponding to the transmission wavelength band passing through each of the first optical filters 510 and 540, the second optical filters 520 and 550, and the third optical filters 530 and 560 may be converted into a pixel signal by the photoelectric conversion element 410 and the readout circuit. As a result, the response of the pixel including the first optical filter 510 or 540 may be configured to follow the response of the low-sensitivity pixel (LPX) shown in FIG. 7, the response of the pixel including the second optical filter 520 or 550 may be configured to follow the response of the high-sensitivity pixel (HPX) shown in FIG. 7, and the response of the pixel including the third optical filters 530 or 560 may be configured to follow the response of the middle-sensitivity pixel (MPX).

Accordingly, the pixel including the first optical filter 510 or 540 may correspond to the low-sensitivity pixel (LPX), the pixel including the second optical filter 520 or 550 may correspond to the high-sensitivity pixel (HPX), and the pixel including the third optical filter 530 or 560 may correspond to the middle-sensitivity pixel (MPX).

The image sensing device 100 based on other implementations of the disclosed technology can allow a plurality of optical filters to have different thicknesses, and can simultaneously implement the low-sensitivity pixel (LPX), the middle-sensitivity pixel (MPX), and the high-sensitivity pixel (HPX) in only one pixel array, such that the image sensing device 100 can form a high dynamic range (HDR) image using only one image.

Although the embodiment in which the pixel (i.e., LPX or MPX) having a relatively lower sensitivity is disposed at a specific position in the quad Bayer pattern structure has been disclosed for convenience of description, the scope or spirit of the disclosed technology is not limited thereto. That is, the position of the pixel having a relatively lower sensitivity may be arbitrarily determined in the pixel array 110. For example, the pixels each having a relatively lower sensitivity may be randomly spaced apart from one another in the same manner as in phase detection autofocus (PDAF) pixels. In addition, the number of pixels each having a relatively lower sensitivity may be determined to meet the required HDR performance.

As is apparent from the above description, the image sensing device based on some implementations of the disclosed technology can obtain a high dynamic range (HDR) image by performing image capture only once (i.e., one photographing action) without changing a complicated structure.

The embodiments of the disclosed technology may provide a variety of effects capable of being directly or indirectly recognized through the above-mentioned patent document.

Although a number of illustrative embodiments have been described, it should be understood that modifications or enhancements to the disclosed embodiments and other embodiments can be devised based on what is described and/or illustrated in this patent document.

What is claimed is:

1. An image sensing device, comprising:
   a first pixel configured to generate an electrical signal in response to incident light and including a first optical filter with a first thickness, the first optical filter configured to transmit the incident light corresponding to a first color and the first pixel having a first sensitivity to the incident light; and
   a second pixel configured to generate another electrical signal in response to the incident light corresponding to the first color and including a second optical filter with a second thickness, the second optical filter configured to transmit the incident light corresponding to the first color and the second pixel having a second sensitivity to the incident light that is different from the first sensitivity,
   wherein the first thickness of the first optical filter is larger than the second thickness of the second optical filter.

2. The image sensing device according to claim 1, wherein:
   the first pixel and the second pixel correspond to a low-sensitivity pixel and a high-sensitivity pixel, respectively, and the electrical signal provided by the first pixel exhibits an increase in response to an increase of an intensity of the incident light that is smaller than that of another electrical signal provided by the second pixel.

3. The image sensing device according to claim 1, wherein each of the first pixel and the second pixel have a corresponding dynamic range that satisfies a predetermined signal-to-noise ratio condition and wherein a maximum value of a dynamic range of the first pixel is higher than a maximum value of a dynamic range of the second pixel and a minimum value of the dynamic range of the first pixel is higher than a minimum value of the dynamic range of the second pixel.

4. The image sensing device according to claim 1, wherein each of the first pixel and the second pixel has a corresponding dynamic range that satisfies a predetermined signal-to-noise ratio condition and wherein a minimum value of a dynamic range of the first pixel is lower than a maximum value of a dynamic range of the second pixel.

5. The image sensing device according to claim 1, wherein light transmittance of the first optical filter is smaller than light transmittance of the second optical filter.

6. The image sensing device according to claim 1, wherein the image sensing device includes a first pixel group in which the first pixel and the second pixel are disposed to be adjacent each other.

7. The image sensing device according to claim 6, further comprising:
a second pixel group disposed at one side of the first pixel group and configured to include a third pixel having a third optical filter and a fourth optical filter that transmit another incident light corresponding to a second color,
wherein a thickness of the third optical filter is larger than a thickness of the fourth optical filter.

8. The image sensing device according to claim 7, further comprising:
a third pixel group disposed at the other side of the first pixel group and configured to include a fifth pixel having a fifth optical filter and a sixth optical filter that transmit another incident light corresponding to a third color,
wherein a thickness of the fifth optical filter is larger than a thickness of the sixth optical filter.

9. The image sensing device according to claim 8, wherein:
the first color is green, the second color is red, and the third color is blue.

10. The image sensing device according to claim 1, further comprising:
a seventh pixel configured to include a seventh optical filter that transmits the incident light corresponding to the first color,
wherein a thickness of the seventh optical filter is smaller than the first thickness of the first optical filter and larger than the second thickness of the second optical filter.

11. The image sensing device according to claim 10, wherein the seventh pixel corresponds to a middle-sensitivity pixel, and
an electrical signal provided by the seventh pixel exhibits an increase in response to an increase of an intensity of the incident light larger than that of the first pixel and smaller than that of the second pixel.

12. The image sensing device according to claim 10, wherein each of the first pixel, the second pixel, and the seventh pixel has a corresponding dynamic range that satisfies a predetermined signal-to- noise ratio condition and wherein a maximum value of a dynamic range of the seventh pixel is lower than a maximum value of a dynamic range of the first pixel, and is higher than a maximum value of a dynamic range of the second pixel; and
a minimum value of the dynamic range of the seventh pixel is lower than a minimum value of the dynamic range of the first pixel, and is higher than a minimum value of the dynamic range of the second pixel.

13. The image sensing device according to claim 10, wherein each of the first pixel, the second pixel, and the seventh pixel has a corresponding dynamic range that satisfies a predetermined signal-to- noise ratio condition and wherein a minimum value of a dynamic range of the seventh pixel is lower than a maximum value of a dynamic range of the second pixel; and
a maximum value of the dynamic range of the seventh pixel is higher than a minimum value of the dynamic range of the first pixel.

14. The image sensing device according to claim 10, further comprising a grid structure disposed between the first pixel and the second pixel to reduce an optical cross talk between the first pixel and the second pixel.

15. An image sensing device, comprising:
a substrate including first and second photoelectric conversion elements that operate to generate photocharges in response to incident light, the first photoelectric conversion element included in a first pixel and the second photoelectric conversion element included in a second pixel; and
an optical filter array disposed over the substrate and configured to include a first optical filter corresponding to the first photoelectric conversion element and having a first thickness and a second optical filter corresponding to the second photoelectric conversion element and having a second thickness,
wherein the first optical filter and the second optical filter are configured to filter a portion of the incident light corresponding to a first color to be received by the photoelectric conversion elements and the first thickness of the first optical filter is larger than the second thickness of the second optical filter, and
wherein the first pixel has a first sensitivity to the incident light and the second pixel has a second sensitivity to the incident light that is different from the first sensitivity.

16. The image sensing device according to claim 15, wherein the first pixel and the second pixel correspond to a low-sensitivity pixel and a high-sensitivity pixel, respectively, and are included in a pixel array.

17. The image sensing device according to claim 16, wherein the pixel array further comprises a third pixel including a third optical filter configured to transmit the incident light corresponding to the first color and having a thickness that is greater than the second thickness of the second optical filter and smaller than the first thickness of the first optical filter.

18. The image sensing device according to claim 16, wherein the pixel array provides a pixel signal that achieves a high dynamic range that ranges from a minimum value of a dynamic range of the second pixel to a maximum value of a dynamic range of the first pixel.

19. The image sensing device according to claim 16, further comprising a grid structure disposed between the first pixel and the second pixel to reduce an optical cross talk between the first pixel and the second pixel.

20. An image sensing device, comprising:
a first pixel configured to generate an electrical signal in response to incident light and including a first optical filter having a first thickness and configured to transmit the incident light corresponding to a first color; and
a second pixel configured to generate another electrical signal in response to the incident light and including a second optical filter having a second thickness and configured to transmit the incident light corresponding to the first color,
wherein the first thickness of the first optical filter is larger than the second thickness of the second optical filter,
wherein the first pixel and the second pixel correspond to a low-sensitivity pixel and a high-sensitivity pixel, respectively, and
wherein light transmittance of the first optical filter is smaller than light transmittance of the second optical filter.

* * * * *